United States Patent [19]

Tallman

[11] Patent Number: 4,773,028

[45] Date of Patent: Sep. 20, 1988

[54] METHOD AND APPARATUS FOR IMPROVED MONITORING AND DETECTION OF IMPROPER DEVICE OPERATION

[75] Inventor: James L. Tallman, Hillsboro, Oreg.

[73] Assignee: Tektronix, Inc., Beaverton, Oreg.

[21] Appl. No.: 656,819

[22] Filed: Oct. 1, 1984

[51] Int. Cl.⁴ ............................................. G06F 11/00
[52] U.S. Cl. .................................. 364/550; 364/150; 364/578; 371/25
[58] Field of Search ............... 364/550, 551, 580, 578, 364/579, 149, 150, 151, 152, 801; 324/73 R, 73 A, 73 T; 340/515; 371/25, 20

[56] References Cited

U.S. PATENT DOCUMENTS

| | | | |
|---|---|---|---|
| 3,221,230 | 11/1965 | Osburn | 364/150 |
| 3,588,487 | 6/1971 | Fricke, Jr. | 364/533 X |
| 3,795,799 | 3/1974 | Courtiol | 364/150 |
| 3,821,645 | 6/1974 | Vinsani | 371/25 |
| 4,001,818 | 1/1977 | Radichel et al. | 371/25 |
| 4,168,527 | 9/1979 | Winkler | 364/580 |
| 4,484,329 | 11/1984 | Slamka et al. | 371/25 |
| 4,630,189 | 12/1986 | Ohmori et al. | 364/150 |
| 4,639,853 | 1/1987 | Rake et al. | 364/510 X |

Primary Examiner—Parshotam S. Lall
Assistant Examiner—Thomas G. Black
Attorney, Agent, or Firm—Allston L. Jones; Robert S. Hulse

[57] ABSTRACT

A method and apparatus is disclosed for the improved monitoring and detection of improper device operation. Operation of a prototype device is first modeled. In particular, a set of test vectors is selected to provide a desired degree of testing of the prototype unit. The expected response of the prototype to the selected set of test vectors is determined through the use of analytical prediction means, and stored for subsequent comparison with the operation of the prototype unit. Thereafter, the selected set of test vectors are applied to the prototype unit, and the response thereto compared in real time with the expected responses. Improper operation of the prototype device is thereby identified, and associate information recorded for subsequent analysis.

21 Claims, 8 Drawing Sheets

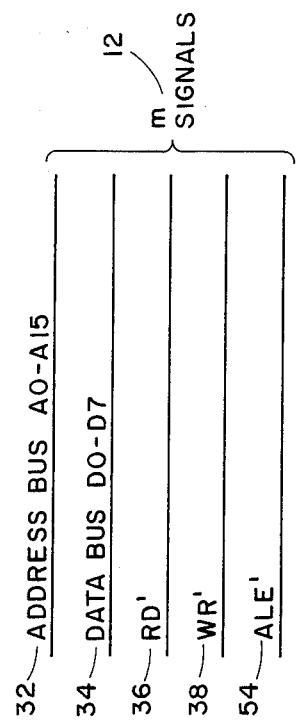
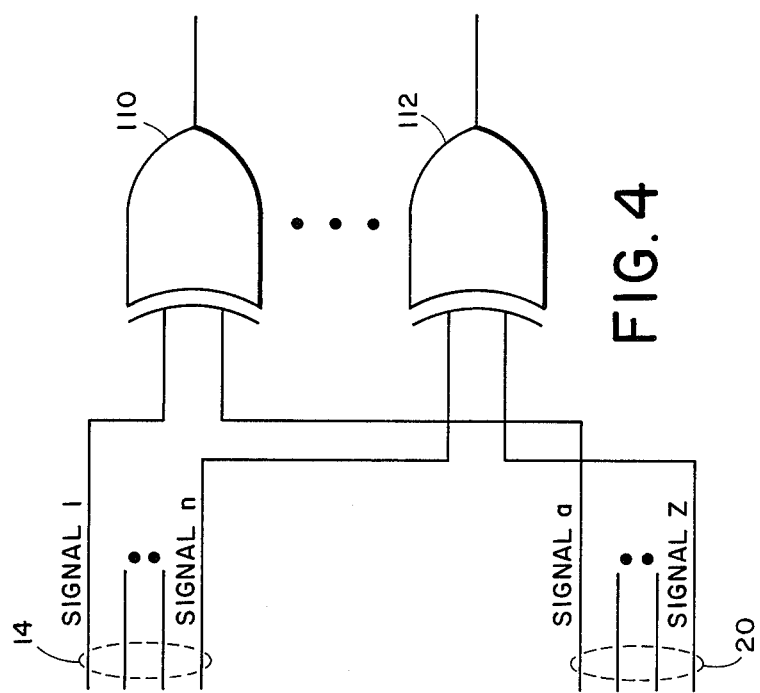
FIG. 2B
FIG. 4

METHOD AND APPARATUS FOR IMPROVED MONITORING AND DETECTION OF IMPROPER DEVICE OPERATION

BACKGROUND

This invention relates to monitoring devices, and more particularly to the real time monitoring and comparing of the operation of a device with analytical predictions of correct or desired operation of the device.

Broadly speaking, a difficult and time consuming task associated with improper operation of a device relates to the identification of problems responsible for improper operation. Once a problem has been clearly identified, well known techniques may be applied to correct the problem. While the task of identifying the source of problems does occur in a repair process, the more demanding and elusive problems seem to appear during the design phase of a device. In such an environment, numerous problems of varying scope are encountered. Frequently, an observed problem may result from several problems, with a somewhat complicated interaction among the various individual problems.

There are a number of considerations associated with the problem identification process. Fundamental to the process is the requirement of being able to monitor an operational environment associated with a device without disturbing the monitored environment; or in the alternative, to minimize the disturbance on the monitored environment by the monitoring process. This requirement has been long recognized, and by way of example, can be observed in the usual high input impedance, or capacitance compensated devices normally associated with typical monitoring devices.

An additional consideration associated with the process of identifying problems associated with devices relates to the complexity of the design of a device. Broadly speaking, the greater the complexity of a design, the greater will be the problems of identifying problems associated therewith. One method of dealing with such problems is to reduce a large design down into a number of smaller units, and thereafter to individually consider problems associated with the various units. While such an approach may be applied in those circumstances when the nature of a design permits such reduction, such an approach does not provide insight into problems of an interactive nature among the various units.

A further consideration associated with the process of problem identification relates to the speed at which a device may operate. In particular, with the higher speeds which are frequently associated with advanced device designs, further considerations are introduced. In particular, in high speed operations the time between the occurrence of events can become quite small, and the number of events which occur quite large. As a result of the foregoing, the location of problems in such an environment can result in the collection of large amounts of data. The subsequent analysis of such prodigious amounts of information can in itself present problems requiring sophisticated and often time consuming analysis techniques. An alternate way of dealing with such a situation involves reducing the speed at which a device operates. However, such an approach introduces a disturbance into the monitored environment by creating an artificial environment differing from the normal operational environment. While such an altered environment may be acceptable in some situations, the dynamic aspects of many designs frequently cannot be supported during a reduction of operating speed. In addition thereto, altering an environment by changing the speed at which a process occurs can introduce further changes which may distort the representation of a problem. A yet further consideration associated with the process of identifying problems associated with devices relates to the manner in which a device may be implemented. In particular, when a new design is implemented as an integrated circuit, or includes devices implemented as integrated circuits, significant restrictions on the availability of information related to the overall operation may be introduced. By way of example, a particular device which performs a given function may have associated with it's internal operation any number of related signals which in themselves represent information of various events indirectly related to the final output of the particular device, but not otherwise generally of interest. However, in the process of identifying the source of incorrect operation of a system which is implemented either as an integrated circuit, or includes integrated circuits in it's design, the aforementioned signals which occur internal to the integrated circuit could provide revealing information with respect to associated problems. Unfortunately, such signals internal to the integrated circuits are not generally available for direct monitoring. In short, the advantages which are gained through the use of integrated circuits, such as compactness, price, and/or speed of operation, carry with them the disadvantages of unavailability of certain information which may necessarily be generated internal to the integrated circuit. Consequently, while the use of integrated circuits may offer significant advantages from both a technical as well as econommic standpoint, their use may likewise presents a significant impediment to the location of associated problems, particularly during a design phase.

In the past, the foregoing problems have been addressed in numerous ways. In the most fundamental approach, corrective action is based entirely upon observation of symptoms, and depends heavily upon a thorough understanding of the operation of the device, and a degree of intuitiveness on the part of the observer. However, with increasingly complex designs, such an approach frequently does not provide an efficient manner in which to determine the source of observed problems.

A second approach to the problem of identifying the source of malfunctions is based upon the use of a known good device against which the operation of the device in question is compared. Broadly stated, such an approach involves the application of identical signals or conditions to both the device whose operation is questioned, as well as to the known good device. Thereafter, the resultant signals from each device are compared, and used to provide guidance in the determination of the cause of a malfunction. While such an approach can provide an approach to the problem identification process, it nevertheless has a number of serious shortcomings. Fundamental among the shortcomings is the requirement of a known good device. From a practical standpoint, the acquisition of a known good device for such use commonly presents the problem of either acquiring the necessary known good device from a supply source, or in the alternative requires building such a device. In the case when the needed device is of the nature of an existing pre-fabricated product, such as a printed circuit card, the problem can be minimal. However, when the device in question is a highly complex integrated circuit, such as a microprocessor or in particular, a custom integrated circuit, the task of acquiring a known good device can become more involved. The problem becomes further acute when signals present within the device which are necessarily generated in the process of producing the final output of the integrated circuit are of interest. In such a situation, it may well become necessary to construct such a device from discrete parts or from other integrated circuits. Such a situation can easily become extremely costly, not only in terms of time, but also in terms of the resources and expertise necessary for such a project.

In addition to the foregoing, other techniques which are employed with respect to microprocessor based designs include the use of emulators and monitor programs. Broadly stated, such approaches provide a limited amount of information with respect to the internal operation of microprocessor based devices, but generally involve some degree of degradation of performance of the device or the associated operational environment. Such degradation is generally unavoidable as it represents an overhead necessary for the performance of the monitoring function. In particular, the use of emulators or software monitor programs generally degrade the time transparency of the monitoring tool. While the impact of such degradation is application dependent, it is undesirable, and a more preferred approach would include either the further minimization or the complete elimination of such side effects.

The foregoing considerations can be illustrated with respect to a microprocessor based designed by the following. Generally speaking, the signals associated with a microprocessor can be broadly classified into three groups: control signals, address signals and data signals. These signals are used to electrically interface a microprocessor with the components associated therewith. Consequently, monitoring these signals can provide some indication of the operations occurring within the microprocessor. A number of techniques have been employed in the past based upon this approach.

In one technique, the address signals from a microprocessor are segregated into two groups. Each address signal present within each group is then assigned a particular binary weight. Thereafter, a corresponding analog signal is derived for each of the signal groups having a magnitude proportional to the binary weight of the signal present on the address lines within each of the two groups. This is generally accomplished through the use of a digital-to-analog converter device. Thereafter, the two analog output signals are used to control the horizontal and vertical deflection plates on an oscilloscope. The resulting display on the oscilloscope will consequently provide some information with respect to the location in memory wherein the microprocessor is currently active. While such an approach does offer the advantage of not disturbing the operational environment within the microprocessor, the information so provided with respect to the internal operation of the microprocessor is very limited.

In yet another technique employing a visual monitoring device, each unique location in memory for a designated portion of memory is assigned a particular location on a visual monitoring device, and the contents of the associated memory location are displayed therein. Consequently, by observing the resulting visual display, it is possible to gain some insight regarding the activities of the microprocessor with respect to the memory.

The foregoing examples are but a few of the approaches which have been employed in the past to gain insight on the internal operations of a microprocessor by monitoring the various signals associated therewith. It will be observed that while each approach shares the common advantage of not disturbing the operation of a program within a microprocessor, the information provided by the monitoring technique has been somewhat limited, failing to provide comprehensive information relating to the internal operations of the microprocessor.

In yet a different approach to the monitoring problem, the microprocessor has been used to monitor itself. In such an approach, a series of programs are used to direct the microprocessor to monitor the contents of various registers and the status of events occurring internal to the microprocessor, and thereafter to report the results.

In one such approach the microprocessor operates under the control of a control program, often referred to as a "monitor program". Operating under the control of the monitor program, the microprocessor performs selected instructions present in a particular program of interest under the strict control of an operator. In such an approach, it is possible for the operator to exercise greater control over the activities of the microprocessor than would otherwise be possible. Such control activities would normally include control over the execution of sequence of instructions, e.g., executing instructions on a one-by-one basis, or executing instructions in groups. At any point in the execution process, it would be possible to monitor the internal state of the microprocessor, and report the status to the operator. Other control activities would include the ability to individually examine, and if necessary change, the contents of any location in an associated memory unit. By employing the approach of using the microprocessor to monitor itself, much greater control and monitoring of the activities of the microprocessor is possible. By using such an approach, the monitoring of parameters internal to the microprocessor is frequently limited only by the complexity of the monitor program itself.

However, notwithstanding the advantages presented by using the microprocessor to monitor itself, such an approach has an inherent short coming which is fundamental to the process. In particular, the basic environment existing during the execution of program instructions is disturbed. This follows from the fact that the microprocessor must not only execute instructions associated with a program of interest, but must also execute the instructions associated with the monitor program. By so executing the monitor program, the microprocessor is performing tasks that it otherwise would not do if it were executing the program alone. Such a short coming can present disadvantages of varying scope. One such disadvantage is in the time required for the execution of the program of interest. Since the microprocessor having to execute both the program of interest as well as the monitor program, additional execution time is clearly required. While this may be acceptable under some conditions, it can be most undesirable under others. In particular, in an application in which it is desired to monitor an environment wherein the microprocessor must not only execute a program of interest, but must also respond to events which are occurring external to the microprocessor, the imposing upon the microprocessor of the additional task of executing the monitor program can significantly alter the basic environment which is desired to be monitored. This result follows from the fact that the time which the microprocessor would otherwise dedicate to the program of interest and responding to events which are occurring external to the microprocessor is reduced by the amount of time required to perform the appropriate portions of the monitor program. Consequently such an approach has the serious short coming of disturbing the environment which is desired to be monitored.

From the foregoing it is observed that while the first basic approach involving the monitoring of the signals from a microprocessor functions in a manner transparenerious short coming of disturbing the environment which is desired to be monitored.

From the foregoing it is observed that while the first basic approach involving the monitoring of the signals from a microprocessor functions in a manner transparent to programs which the microprocessor may be executing, such an approach provides very limited information regarding the particular operations occurring internally to a microprocessor.

In a similar manner, it is observed that while the second basic approach involving using a microprocessor to monitor itself does provide more detailed information regarding the internal operations of a microprocessor, such an approach has the disadvantage of disturbing the environment within the microprocessor in which programs execute.

From the foregoing it is apparent that there are a number of shortcomings in the prior art in determining the source of problems associated with improper device operation. Undesirable effects present with such approaches either violate a fundamental consideration of monitoring techniques by disturbing the monitored environment, or burdening available resources by requiring the construction of models.

SUMMARY

In accordance with the present invention, a method and apparatus are disclosed with provide for the real time monitoring of the activity of a device without disturbing the operating environment associated therewith. Broadly stated, in accordance with the present invention, responses of a device to a selected set of test conditions are compared against predicted correct responses. Improper responses are thereby determined in real time immediately upon the occurrence thereof, with the corresponding information stored for subsequent analysis. Thereafter, by comparing the predicted correct response and the observed actual response to a set of selected test conditions, insight is gained as to the source of a problem.

In accordance with the present invention, an analytical model of a device is first constructed. Broadly stated, the model serves as a means to predict the correct operation or response of the device to a given condition or set of conditions. Consequently, by choosing conditions appropriate to provide for comprehensive testing of either all or a selected group of features of the actual device, the anticipated responses of the actual device to such conditions may be determined. The set of chosen test conditions are generally referred to as test vectors. In accordance with the present invention, the response of a device to a chosen set of test vectors as determined through the use of a model of the device are determined. The responses are then stored for subsequent comparison purposes.

Consequently, through the use of a model to predict the response of a device to a selected set of input conditions, the corresponding set of expected outputs may be determined. Thereafter, by applying the selected set of input conditions to the actual device, and recording the resultant responses of the devices thereto, while simultaneously comparing the observed response of the device with the response predicted by the model, improper responses from the device may be immediately detected. Thereafter, the input conditions, i.e., the test vectors, as well as the desired and observed responses may be reviewed for indications with respect to the locations of problems with the device.

DESCRIPTION OF THE FIGURES

FIG. 2B is an illustration of signals associated with the Engineering Prototype Unit of FIG. 2A.

FIG. 4 is an illustration of an implementation of the Comparators illustrated in FIG. 1.

DETAILED DESCRIPTION

In accordance with the present invention, apparatus and method are disclosed which provide for the improved monitoring and detection of improper device operation. Broadly stated, the expected operation of a device in response to a selected set of test conditions is first determined through the use of a model. The response of the device as predicted by the model is then stored for subsequent comparison purposes. Thereafter, the selected test conditions are applied to the device, and the responses thereto are compared against the responses predicted by the model. Improper device operation is thereby determined by comparing the response of the device with the response predicted by the model.

Figure 1:
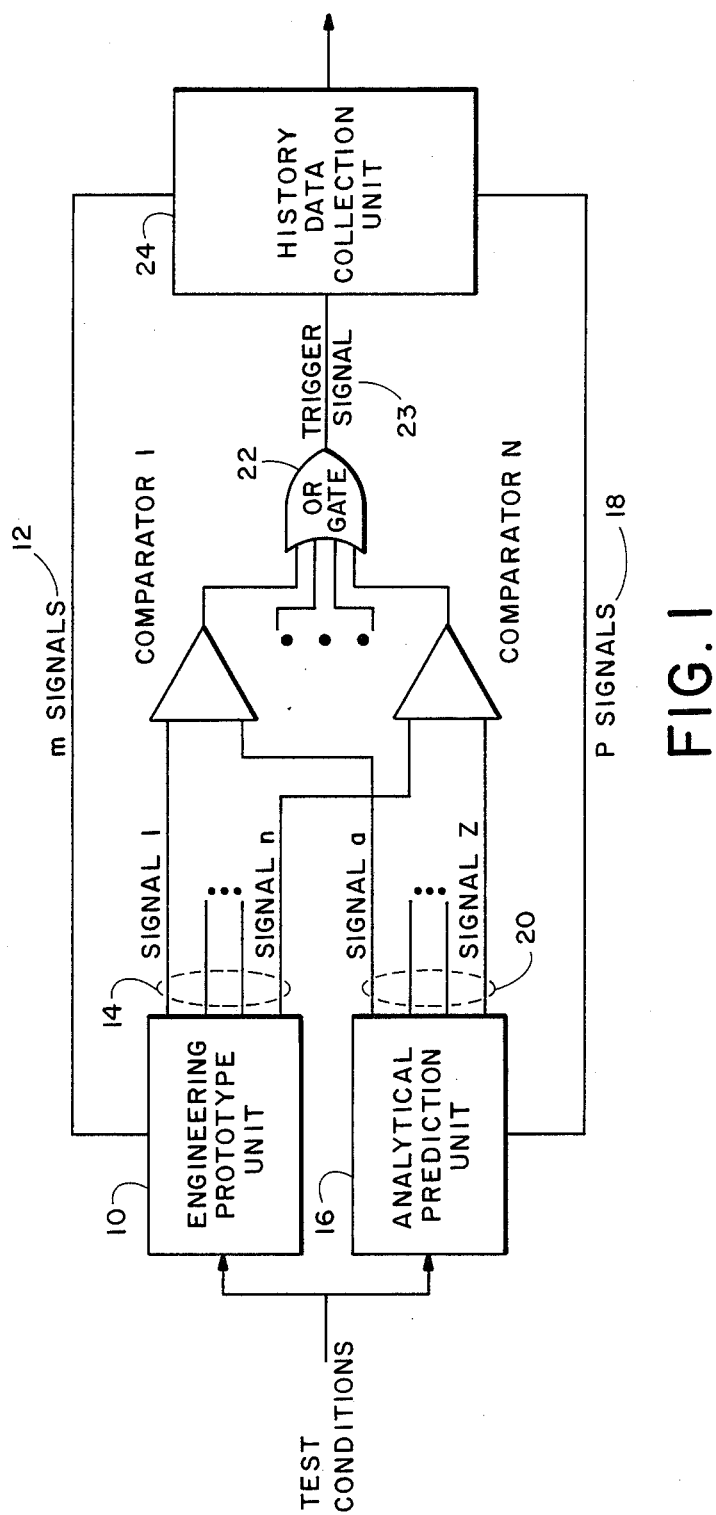
FIG. 1 is a conceptual representation of a method and apparatus for the improved monitoring and detection of improper device operation in accordance with the teachings of the present invention.

For a general understanding of monitoring and detection apparatus incorporating the teaching of the present invention, reference is now had to FIG. 1. Engineering Prototype Unit 10 may represent any of a broad range of devices for which the operation thereof is desired to be monitored. Broadly stated, Engineering Prototype Unit 10 has a number of types of signals associated therewith. A first type of signal associated with Engineering Prototype Unit 10 represents signals containing information associated with the operation of Engineering Prototype Unit 10. Signals of this nature are indicated in FIG. 1 by m signals 12. An additional type of signal associated with Engineering Prototype Unit 10 are signals from which improper operation of Engineering Prototype Unit 10 may be determined. These signals are indicated generally in FIG. 1 as signals 14, and collectively are comprised of signal 1 thru signal n. The specific nature of m signals 12 and signals 14 associated with Engineering Prototype Unit 10 will depend upon the specific functions performed by Engineering Prototype Unit 10, and are consequently application dependent, as will be more fully discussed hereinafter.

Broadly stated, Analytical Prediction Unit 16 contains information of a predictive nature with respect to the operation of Engineering prototype Unit 10, and functions to produce signals representative of the the correct or desired signals produced by Engineering Prototype Unit 10 in response to selected set of input conditions. As was the case with respect to Engineering Prototype Uint 10, Analytical Prediction Unit 16 will generally have a number of types of signals associated therewith. A first type of signal associated with Analytical Prediction Unit 16 generally represent information associated with the correct operation of Engineering Prototype Unit 10. Signals of this nature are indicated generally in FIG. 1 by p signals 18. An additional type of signal associated with Analytical Prediction Unit 16 are signals which may indicate the improper operation of Engineering Prototype Unit 10. These signals are indicated generally in FIG. 1 as signals 20, and are comprised of signal a thru signal z. The specific nature of p signals 18 and signals 20 associated with Analytical Prediction Unit 16 will depend upon the specific functions performed by Engineering Prototype Unit 10, and are consequently application dependent, as will be more fully discussed hereinafter. It should further be understood that the signals 12 and 14 associated with Engineering Prototype Unit 10 and signals 18 and 20 associated with Analytical Prediction Unit 16 may vary in number depending upon the particular implementation of Engineering Prototype Unit 10 and Analytical Prediction Unit 16. Comparator 1 thru Comparator N represent a plurality of identical comparing devices, each of which operates in the following manner. Each comparator has two inputs signals and one output signal associated therewith. The output signal can assume one of two possible states: a first state indicating agreement between the two input signals to the comparator, and a second state indicating disagreement between the two input signals to the comparator. OR GATE 22 is a device having a plurality of input signals and one output signal associated therewith, and functions to produce an output signal in response to the appearance of a signal on any one of the plurality of input signals thereto. The number of input signals associated with OR GATE 22 is determined by the number of Comparators, and is consequently determined by a particular application. Broadly stated, History Data Collection Unit 24 functions as a storage device. In particular, pursuant to a trigger signal 23 supplied thereto, History Data Collection Unit 24 functions to store information from from Engineering prototype Unit 10 associated with the operation thereof as contained within m signals 12 as well as information from Analytical Prediction Unit 16 representing correct operation of Engineering Prototype Unit 10 as contained in p signals 18. The foregoing information is stored by History Data Collection Unit 24 for subsequent analysis, as will be discussed more fully hereinafter.

The foregoing described apparatus is configured in the following manner. A set of pre-selected test vectors are simultaneously coupled to Engineering Prototype Unit 10 and Analytical Prediction Unit 16. The manner in which the preselected test vectors are coupled to Engineering Prototype Unit 10 and Analytical Prediction Unit 16 will be determined by the particular application: the test vectors could be coupled either directly or indirectly. In particular, the test vectors could be comprised of a set of test signals which are directly coupled to the apparatus herein. In yet a different application, however, the chosen set of test vectors could be represented by a chosen set of operations to be performed by the apparatus herein. In such an application, the test vectors would be considered to be indirectly coupled to the apparatus herein. Signal 1 thru Signal n of signals 14 from Engineering Prototype Unit 10 are each coupled to a first input of Comparators 1 thru Comparators N, respectively. In a similar fashion, Signal a thru Signal z of signals 20 from Analytical Prediction Unit are each coupled to the corresponding second input of Comparators 1 thru N. Each output from Comparator 1 thru Comparator N is coupled to an input of OR GATE 22. The output of OR GATE 22 is then coupled to History Data Collection Unit 24, and functions as trigger signal 23. The m signals 12 from Engineering Prototype Unit 10 and p signals 18 from Analytical Prediction Unit 16 are likewise coupled to History Data Collection Unit 24.

Apparatus in accordance with the present invention as illustrated in FIG. 1 operates in the following manner. the operation of Engineering Prototype Unit 10 is first modeled by suitable methods or apparatus. In particular, a set of test vectors is first selected which will provide a desired degree of testing of Engineering Prototype Unit 10. In this regard, it should be noted that the selected set of test vectors could provide for either the testing of a particular part of the operation of Engineering Prototype Unit 10, or a comprehensive testing of the entire operation of Engineering Prototype Unit 10. Consequently, the expected response of Engineering Prototype Unit 10 to a selected set of test conditions is first determined by analytical means. In this regard it should be observed that there are numerous ways in which the expected response of Engineering Prototype Unit 10 to a selected set of test vectors may be determined. The means by which the expected response may be determined include not only the determination of same by a careful analysis of the design of Engineering Prototype Unit 10 to each of the selected test vectors by manual techniques, but also may include automated apparatus which functions to likewise determine expected responses to a given set of test conditions by apparatus specifically designed for such purposes. Such specially designed apparatus could include both hardware and software type devices. One example of such a device is the generally known TEGAS software program. Subsequent to the determination of the expected responses of Engineering Prototype Unit 10 to a selected set of test vectors, the determined responses thereto are stored in Analytical Prediction Unit 16 for subsequent use, as will be more fully discussed hereinafter. Next, the selected set of test vectors are simultaneously applied to both Engineering Prototype Unit 10 and Analytical Prediction Unit 16. Comparator 1 thru Comparator N function to monitor signals 14 from engineering Prototype Unit 10, as well as signals 20 from Analytical Prediction Unit 16. Upon the occurrence of a signal from Engineering Prototype Unit 10 which does not agree with the associated predicted signal from Analytical Prediction Unit 16, the associated information from Engineering Prototype Unit 10 as present on m signals 12 and from analytical Prediction Unit 16 as present on p signals 18 wil be recorded by History Data Collection Unit 24. Consequently, upon the occurrence of a condition as represented by the state of a signal on signal lines 14 from Engineering Prototype Unit 10 which disagrees with the corresponding predicted signal as represented by the state of a signal on signal lines 20 from Analytical prediction Unit 16, the corresponding accompanying information from both Engineering Prototype Unit 10 and Analytical Prediction Unit 16 will be recorded by History Data Collection Unit 24 for subsequent analysis.

Figure 2A:
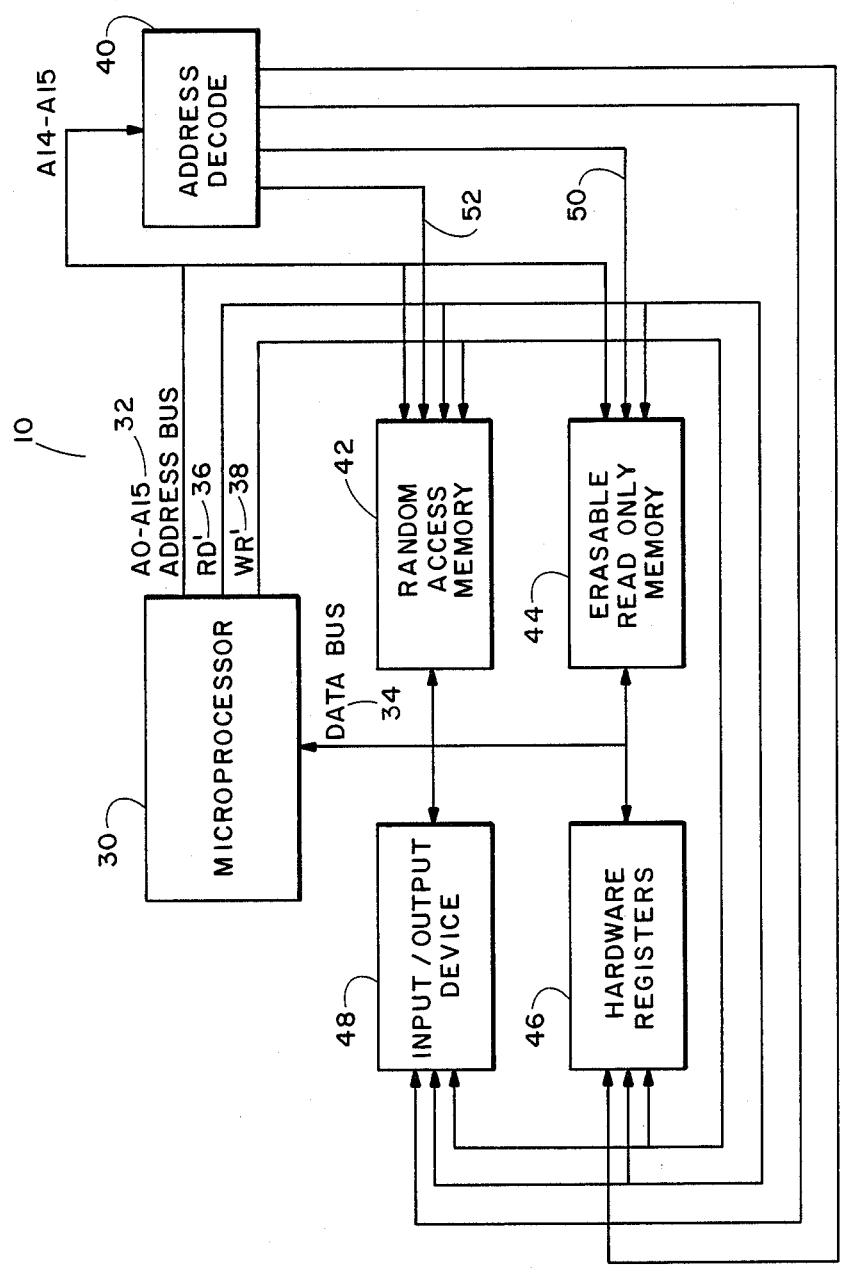
FIG. 2A is an illustration of a microprocessor based Engineering Prototype Unit.

The foregoing principles of operation of apparatus incorporating the teachings of the present invention will be more fully understood by considering FIG. 2A wherein Engineering Prototype Unit 10 is illustrated as an apparatus incorporating a microprocessor. Referring to FIG. 2A, microprocessor 30 has associated therewith Address Bus 32, Data Bus 34, and control signals RD' 36 and WR' 38. Microprocessor 30 may be any of a wide variety of microprocessors. For the purposes of the present discussion however, a model 8085 microprocessor available from INTEL Corporation of Santa Clara, California will be assumed. However, it is understood that the selection of the model 8085 microprocessor is for illustration purposes only, as the principles in accordance with the present invention would similarly apply to other microprocessors. As the model 8085 microprocessor is herein assumed, several characteristics unique to the model 8085 microprocessor will be understood. In particular, Address Bus 32 will be comprised of 16 uni-directional signal lines A0 thru A15, and Data bus 34 will be comprised of 8 bi-directional signal lines. It will also be understood that as a portion of the address signals are multiplexed on the Data Bus of the 8085 microprocessor, it is consequently necessary to provide a latching mechanism to derive an address from the signals associated with the model 8085 microprocessor through the use of the Address Latch Enable signal generated by the 8085 microprocessor, hereinafter referred to as ALE' 54. Consequently, microprocessor 30 will be assumed to include not only the 8085 microprocessor, but also the necessary associated address latch apparatus. In practice a model 74LS373 OCTAL D TYPE LATCH manufactured by Texas Instruments of Dallas, Tex. could be used to implement the necessary latching apparatus in a manner well known to those skilled in the art. Likewise associated with the model 8085 microprocessor are signals which indicate the occurrence of either a read or a write operation by the 8085 microprocessor. These functions are indicated by the signals RD' 36 and WR' 38 respectively. In particular, the assumption of RD' signal 36 of a low state indicates the occurrence of a read operation by the 8085 microprocessor. In a similar fashion, the assumption of WR' signal 38 of a low state indicates the occurrence of a write operation by the 8085 microprocessor. Address decode 40 functions to decode selected address signal lines from microprocessor 30 in a manner well known to those skilled in the art. For the purposes of the present illustration, Address Decode 40 will decode two of the sixteen address lines from microprocessor 30: address lines A14 and A15. While there are many ways in which address decoding may be implemented, one particular way would employ the use of a model 74LS138 3-TO-8 LINE DECODERS/MULTIPLEXERS, and would be configured in a manner well known to one skilled in the art. The model 74LS138 3-TO-8 LINE DECODERS/MULTIPLEXERS is manufactured by Texas Instruments of Dallas, Tex. Random Access Memory 42 functions to both store information as well as supply information previously stored therein in response to control signals from microprocessor 30. Random Access Memory 42 may be implemented by any number of memory devices. One particular memory device would be a model 2115 Random Access memory device manufactured by INTEL Corporation of Santa Clara, Calif. Erasable Read Only Memory 44 functions to supply information previously stored therein pursuant to control signals from microprocessor 30. Erasable Read Only Memory 44 may be implemented by any number of devices. One such device would be a model 2732 Erasable Read Only Memory manufactured by Intel Corporation of Santa Clara, California. Hardware Registers 46 function to provide a general storage function. While there are many devices which may be used to provide such general storage functions, a model 74LS 273 OCTAL D-TYPE FLIP-FLOP may be used to implement the function. The model 74LS 273 device is manufactured by Texas Instruments of Dallas, Tex. Input/Output Device 48 provides for the interfacing of the microprocessor based design generally illustrated in FIG. 2A to external associated apparatus. While there are many different types of devices which may provide such interfacing functions, a model 8251 PROGRAMMABLE COMMUNICATIONS INTERFACE device manufactured by INTEL Corporation of Santa Clara, Calif. is generally illustrative of the type of devices which may be used.

The foregoing described apparatus would typically be configured in the following manner. Address signal lines A0 thru A13 from Microprocessor 30 would be coupled to Random Access Memory 42 and Erasable Read Only Memory 44. Address signal lines A14 and A15 would be coupled to Address Decode 40. The signals from Microprocessor 30 indicating the occurrence of a read or write operation, i.e. RD' 36 and WR' 38, would couple to Random Access Memory 42, Hardware Registers 46 and Input/Output Device 48. Read signal RD' 36 would further couple to Erasable Read Only Memory 44. Data Bus 34 associated with microprocessor 30 would couple to Input/Output Device 48, Hardware Registers 46, Erasable Read Only Memory 44 and Random Access Memory 42.

The foregoing described apparatus would operate in the following manner. Microprocessor 30 would generally reference information contained in Erasable Read Only Memory 44 in the execution of programs pursuant to the particular purpose for which the apparatus of FIG. 2A was designed. In particular, upon the initiation of a read operation by Microprocessor 30, read signal RD' 36 associated therewith would be placed in an active, or low state. In addition, upon the reference of a particular storage location within Erasable Read Only Memory 44, Microprocesor 30 would place the address of the desired storage location on signal lines A0 thru A15 of Address Bus 32. Signal lines A1 thru A13 would couple to Erasable Read Only Memory 44 to identify a particular storage location therein. Signal lines A14 and A15 would couple to Address Decode 40. Address Decode 40 would then decode the signals present on signal lines A14 and A15, and therefrom generate an enable signal on signal line 50 to the Erasable Read Only Memory 44. Enable signal on line 50 from Address Decode 40 would, together with the active state of the read signal RD' 36 function to enable Erasable Read Only Memory 44, and thereby permitting the information stored in the storage location designated by the signals present on signal lines A0 thru A14 to be placed on signal lines D0 thru D7 of Data Bus 34. In this manner, the information stored in the referenced storage location within Erasable Read Only Memory 44 would be made available to Microprocessor 30. Microprocessor 30 would in a similar manner access other storage locations within Erasable Read Only Memory 44 for desired information. In a similar manner, Microprocessor 30 would access information contained within storage locations within Random Access Memory 42. Microprocessor 30 would follow a similar process in storing information within a selected storage location within Random Access memory 42, with the function of Read Signal RD' 36 replaced by Write Signal WR' 38. In particular, upon the initiation of a write operation by Microprocessor 30, Microprocessor 30 would place the information which is desired to be stored in a storage location within Random Access Memory 42 on signal lines D0 thru D7 of Data Bus 34, and thereafter place write signal WR' 36 associated therewith in an active, or low state. In addition, Microprocessor 30 would place the address of the desired storage location on signal lines A1 thru A15 of Address Bus 32. Signal lines A0 thru A14 would couple to Random Access Memory 42 to identify a particular storage location therein. Address Decode 40 would decode the signals present on signal lines A14 and A15, and therefrom generate an enable signal on signal line 52 to Random Access Memory 42. The Enable signal on line 52 from Address Decode 40 would, together with the active state of the write signal WR' 38 function to enable Random Access Memory 42, thereby permitting the information present on signal lines D0 thru D7 of Data Bus 34 to be stored in the storage location designated by the signals present on signal lines A0 thru A15 within Random Access Memory 42. In a similar manner, information would be presented to or read from Input/Output Device 48 and Hardware Registers 46.

It should be understood that while the foregoing describes a particular implementation of a microprocessor based design, the broad architecture of the design discussed with respect to FIG. 2A would be similar with other implementations, which may employ yet other models of microprocessors and other peripheral devices. By way of example, a different design might employ a different model of microprocessor, and may omit hardware registers 46 and input/output devices 48, and include different associated apparatus, such as voice synthesis or graphics devices. Notwithstanding the particular implementation, there will necessarily be associated with the particular design signals which contain information associated with the operation of the system. Broadly stated, such signals will include signals which are representative of the operation of the apparatus, and have been previously broadly discussed with respect to m signals 12 of FIG. 1, and signals from which improper operation of the device may be determined, e.g., signals 14 of FIG. 1. As previously discussed, the precise nature of such signals will be determined by the design of a particular application, and the nature of the information which is desired to be monitored. FIG. 2B illustrates the foregoing with respect to the microprocessor based design illustrated in FIG. 2A. Referring to FIG. 2B, signals representative of the operation of the apparatus illustrated in FIG. 2A, i.e. m signals 12, would include the sixteen signals A0 thru A15 comprising Address Bus 32, eight signals D0 thru D7 comprising Data Bus 34, Read Signal RD' 36, Write Signal WR' 38 and Address Latch Enable signal ALE' 54. Signals from which improper operation of the apparatus of FIG. 2A may be determined will be generally determined by the choice of operations which are desired to be monitored. However, for the purposes of the present illustration, the same set of signals illustrated in FIG. 2B will be used. In this regard, it is understood that the selection of the same set of signals is by way of illustration only, and that other signals may likewise be chosen, as will be more fully discussed hereinafter.

Figure 3:
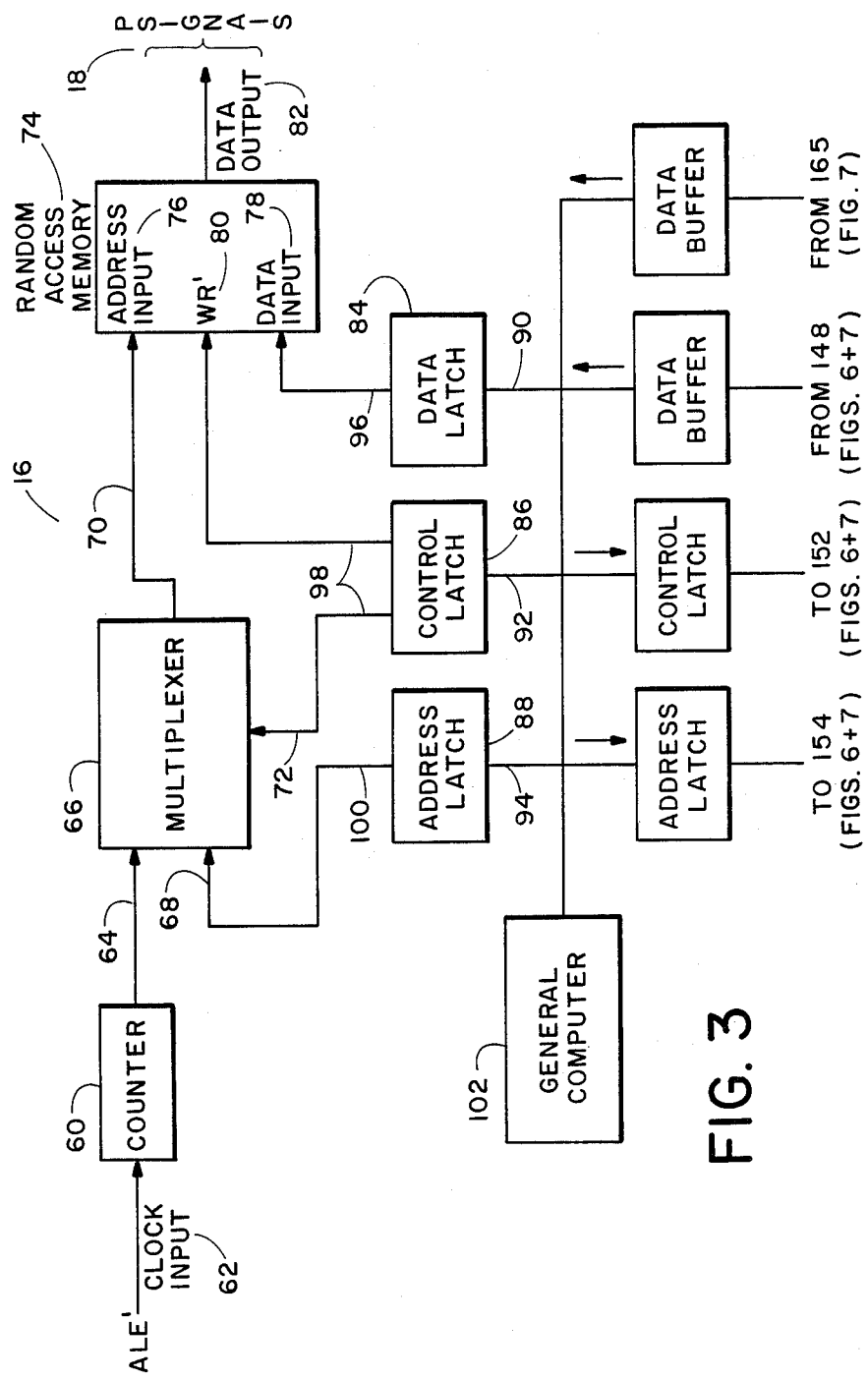
FIG. 3 is an illustration of an implementation of an Analytical Prediction Unit in accordance with the teachings of the present invention.

Referring once again to FIG. 1, Analytical Prediction Unit 16 serves to store the predicted response of Engineering Prototype Unit 10 to a selected set of test vectors. While there are many different ways in which to implement the functions of Analytical Prediction Unit 16, FIG. 3 illustrates one particular implementation. Referring to FIG. 3, Counter 60 is a sixteen bit binary counter having a clock input 62, and sixteen output lines, each of which has a binary weight associated therewith so that collectively, signal lines 64 represent a sixteen bit binary number. While there are numerous ways in which counter 60 may be implemented, one such manner is through the use of two model 74LS393 DUAL 4-BIT BINARY COUNTER integrated circuit devices, manufactured by Texas Instruments, Incorporated of Dallas, Tex. The two 74LS393 DUAL 4-BIT BINARY COUNTERS would be configured in a manner well known to one of ordinary skill in the art to implement a single sixteen bit binary counter. Broadly stated, Multiplexer 66 functions as a switch to couple one of two groups of input signals 64 or 68, to a group of output signals 70. In particular, each group of input signals 64 or 68 is comprised of sixteen individual signals. Pursuant to a control signal 72, Multiplexer 66 functions to couple the sixteen signals comprising signal group 64 or signal group 68 to output signals 70. While there are numerous ways in which multiplexer 66 may be implemented, one such manner is through the use of eight model 74LS253 DUAL DATA SELECTORS/MULTIPLEXERS manufactured by Texas Instruments, Incorporated of Dallas, Tex. The eight 74LS253 DUAL DATA SELECTORS/MULTIPLEXERS would be configured in a manner well known to one of ordinary skill in the art to implement a single multiplexer receiving two sixteen bit inputs and a single sixteen bit output. Random Access Memory 74 functions as a storage device to store information provided thereto, and thereafter, pursuant to appropriate requests thereto, to supply the information previously stored therein. While there are numerous wyas in which Random Access Memory 74 may be implemented, one such manner is through the use of a plurality of random access memory integrated circuits, such as the model 2115A HIGH SPEED STATIC RAM integrated circuit, manufactured by Intel Corporation of Santa Clara, Calif. The precise number of such devices would be determined by the amount of information which is desired to be stored therein, as will be further discussed hereinafter, and the manner of configuration of the plurality of 2115A HIGH SPEED STATIC RAM integrated circuit would be well known to one of ordinary skill in the art. However, notwithstanding the particular devices chosen to implement Random Access Memory 74, there will necessarily be associated therewith Address Input 76, Data Input 68, Write Enable signal WR' 80, and Data Output 82. In particular, the signals coupled to Address Input 76 would specify the particular storage location contained within Random Access Memory 74 wherein the information present on DATA Input 78 is to be stored. The actual storage of the foregoing information at the specified location within Random Access Memory 74 would take place at the occurrence of write enable signal WR' 80. Thereafter, the information contained within Random Access Memory 74 could be read therefrom from Data Output 82 in a manner well known to one of ordinary skil in the art. Data Latch 84, Control Latch 86 and Address Latch 88 function to provide for the temporary storage of information presented to the respective inputs 90, 92 and 94 thereof. The information temporarily stored in Data Latch 84, Control Latch 86 and Address Latch 88 is thereafter applied to the respective outputs 96, 98 and 100 thereof. General Computer 102 is a general purpose digital computer which functions to determine the expected responses of Engineering Prototype Unit 10 to the preselected set of test vectors (FIG. 1), and thereafter, direct the storage of the associated information into Random Access Memory 74, as will be more fully discussed hereinafter. General Computer 102 has Data Bus 104 associated therewith through which General Computer 102 communicates with Data Latch 84, Control Latch 86 and Address Latch 88. General Computer 102 may further be used to examine and analyize information contained within History Data Collection Unit 24 (FIG. 1) as will be more fully described hereinafter. Address Latch 91, Control Latch 93, Data Buffer 95 and Data Buffer 97 function to couple General Computer 102 to signals 154, 152, 148 (FIG. 6) and 165 (FIG. 7) respectively, as will be more fully discussed hereinafter. While there are a broad range of digital computers which may perform the functions of General Computer 102, one such general purpose digital computer is the Tektronix Model 8560 Microcomputer Development Lab system.

The foregoing described apparatus is configured in the following manner. ALE' signal 54 (FIG. 2B) is coupled to Clock Input 62 of Counter 60. The sixteen signal lines 64 from Counter 60 are coupled to one input 64 of Multiplexer 66. Output signals 70 from Multiplexer 66 are coupled to the address input 76 of Random Access Memory 74. Data Bus 104 of General Computer 102 is coupled to inputs 90, 92 and 94 of Data Latch 84, Control Latch 86 and Address Latch 88 respectively. The output 100 of Address Latch 88 is coupled to the second input 68 of Multiplexer 66. A first output of Control Latch 86 is a control signal 72 which is coupled to the control input of Multiplexer 66, and the second output of Control Latch 86 is likewise a control signal which is coupled to the Write Enable WR' input 80 of Random Access Memory 74. The output of Data Latch 84 is coupled to Data Input 78 of Random Access Memory 74.

Initially, the operations of Engineering Prototype Unit 10, as illustrated by way of example in FIG. 2A, would first be modeled by suitable means, as previously discussed. In particular, with respect to the apparatus of FIG. 2A, the individual state of each of the signals contained within m signals 12 (FIG. 2B) would be determined for the preselected set of test vectors. As m signals 12 are comprised of a total of 27 separate signals, the status of each of the 27 signals would be individually determined, and subsequently stored in Random Access Memory 74, as discussed hereinafter.

The foregoing described apparatus of FIG. 3 would operate in the following manner. Initially General Computer 102 would supply the appropriate signal to Control Latch 86 to direct Multiplexer 66 to couple the signals from Address Latch 88 to output signals 70 of Multiplexer 66, and consequently to Address Input 76 of Random Access Memory 74. Thereafter, General Computer 102 would store the results of the modeling of Engineering Prototype Unit 10 in Random Access Memory 74. In particular, General Computer 102 would sequentially place data and the corresponding address associated therewith through Data Latch 84 and Address Latch 88 into sequential memory locations within Random Access Memory 74. Thereafter, General Computer 102 through Control Latch 86 would configure Multiplexer 66 to couple the sixteen output lines associated with Counter 60 to Address Input 76 of Random Access Memory 74. In a similar fashion, General Computer 102 would configure Random Access Memory 74 for read operations through the status of Write Enable WR' signal 80 by Control Latch 86. Thereafter, Counter 60 would function to define sequential storage locations within Random Access Memory 74 from which the information previously stored therein would be placed on Data Output 82 of Random Access Memory 74. In the present implementation, Data Output 82 is comprised of 27 signals, which correspond to signals 20 of FIG. 1. In a similar manner as with Engineering Prototype Unit 10, wherein m signals 12 and signals 14 were identical, p signals 18 and signals 20 are likewise identical in this illustration.

Referring once again to FIG. 1, Comparator 1 thru Comparator N serve to compare corresponding signals from Engineering Prototype Unit 10 and Analytical Prediction Unit 16. While there are many different ways in which to implement the functions of Comparator 1 thru Comparator N, FIG. 4 illustrates a portion of one particular implementation. Referring to FIG. 4, the functions of Comparator 1 thru Comparator N are implemented by the use of EXCLUSIVE-OR gates 110 thru 112. As is well known, an EXCLUSIVE-OR gate produces an output signal only if there is a difference between the states of the respective inputs thereto. Consequently a plurality of EXCLUSIVE-OR gates are used to perform the comparison functions between the respective signals contained within signals 14 from Engineering Prototype Unit 10 and signals 20 from Analytical Prediction Unit 16. In particular, the first signal from Engineering Prototype Unit 10 signal 1 is coupled to a first input of EXCLUSIVE-OR gate 110, and the corresponding first signal a from Analytical Prediction Unit 16 is coupled to the second input of EXCLUSIVE-OR gate 110. In operation, EXCLUSIVE-OR gate 110 will not produce an output signal if the logic states of the signals coupled to the respective inputs thereto are the same; EXCLUSIVE-OR gate 110 will only produce an output signal if the logic states of the signals coupled to the respective inputs thereto are different. Consequently, EXCLUSIVE-OR gate 110 will only produce an output signal if there is a difference between the corresponding signals from Engineering Prototype Unit 10 and Analytical Prediction Unit 16. I a similar manner, similar signals from Engineering Prototype Unit 10 and Analytical Prediction Unit 16. In a similar manner, similar signals from Engineering Prototype Unit 10 and Analytical Prediction Unit 16 are each compared on an individual basis, and the occurrence of a difference between a signal from Engineering Prototype Unit 10 and the corresponding signal from Analytical Prediction Unit 16 is detected. The EXCLUSIVE-OR gate may be implemented by use of a model 74LS86 QUADRUPLE 2-INPUT EXCLUSIVE-OR GATE integrated circuit manufactured by Texas Instruments, Incorporated of Dallas, Tex.

The comparison functions performed by Comparator 1 thru Comparator N would be implemented by the use of twenty-seven EXCLUSIVE-OR gates, with respect to the illustrative Engineering Prototype Unit 10 of FIG. 2A and Analytical Prediction Unit 16 of FIG. 3. In particular, each of the twenty-seven signals comprising m signals 12 (FIG. 2B) would be coupled to a first input of each of the twenty-seven EXCLUSIVE-OR gates. Each of the twenty-seven signals comprising p signals 18 from Data Output 82 of Random Access Memory 74 would each be coupled to the second input of each of the corresponding EXCLUSIVE-OR gates. Consequently, the twenty-seven EXCLUSIVE-OR gates would collectively function to compare each of the signals present with m signal 12 with the corresponding signal present within p signal 18 to detect the occurrence of a signal from Engineering Prototype Unit 10 which did not agree with the expected signal as generated by Analtyical Prediction Unit 16.

Figure 5:
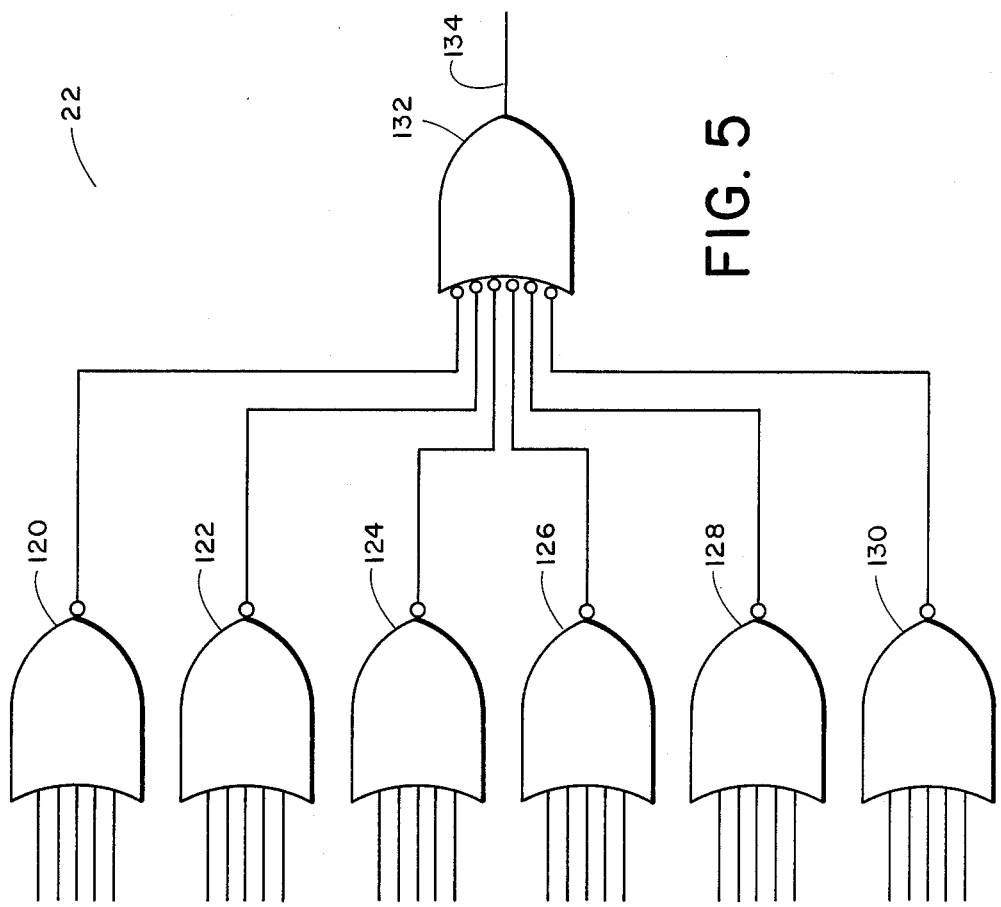
FIG. 5 is an illustration of the OR GATE of FIG. 1.

Referring once again to FIG. 1, or GATE 22 functions to simultaneously monitor the output of Comparator 1 thru Comparator N, and to produce a signal in response to the occurrence of a signal from any of the comparator devices. While there are many different ways in which to implement the functions of OR GATE 22, FIG. 5 illustrates one particular implementation. Referring to FIG. 5, the function of OR GATE 22 are implemented through the use of a plurality of 5-INPUT POSITIVE NOR gates and a 6-INPUT POSITIVE NAND gate. In particular, logic gates 120, 122, 124, 126, 128 and 130 are each a 5-INPUT POSITIVE NOR gate, and logic gate 132 is a 6-INPUT POSITIVE NAND gate. The output from each EXCLUSIVE-OR gate 110 thru 112 (FIG. 4) is coupled to an input of one of the 5-INPUT POSITIVE NOR gates. The output from each of the 5INPUT POSITIVE NOR gates 120, 122, 124, 126, 128 and 130 are each coupled to an input of 6-INPUT POSITIVE NAND gate 132. Consequently 6-INPUT POSITIVE NAND GATE 132 will produce an output signal 134 upon the occurrence of a signal on any of the inputs to any of the 5-INPUT POSITIVE NOR gates 120, 122, 124, 126, 128 or 130. Referring once again to FIG. 1, signal 134 from 6-INPUT POSITIVE NAND gate 123 would correspond to trigger signal 23.

Figure 6:
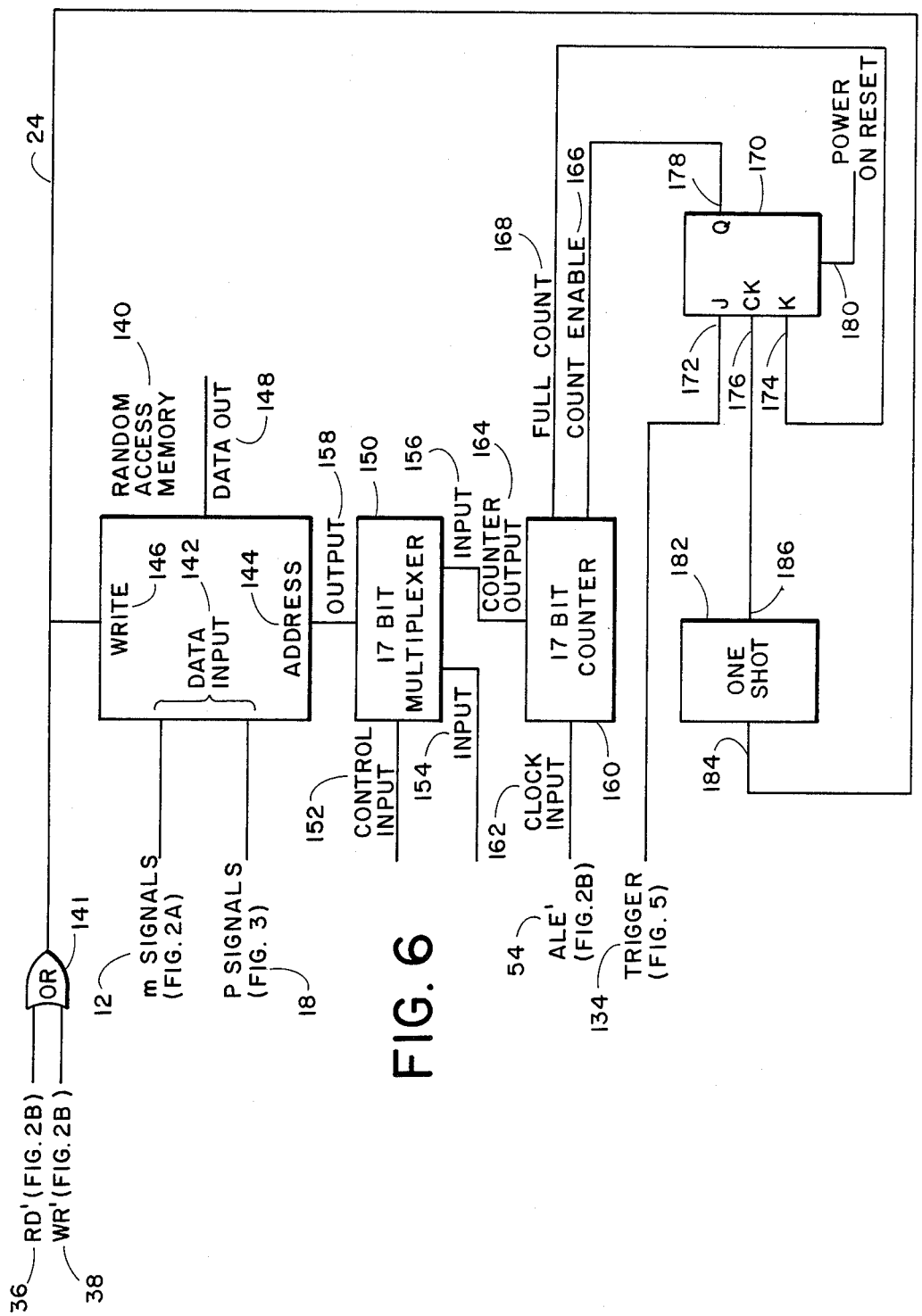
FIG. 6 is an illustration of an implementation of a history Data Collection Unit in accordance with the teachings of the present invention.

Referring once again to FIG. 1, History Data Collection Unit 24 functions to record information associated with the operation of Engineering Prototype Unit 10 and corresponding information from Analytical Prediction Unit 16 for subsequent analysis. In particular, History Data Collection Unit 24 functions to record m signals 12 associated with Engineering Prototype Unit 10 and p signals 18 associated with Analytical Prediction Unit 16 pursuant to the occurrence of trigger signal 23. While there are many different ways in which to implement thediction Unit 16 pursuant to the occurrence of trigger signal 23. While there are many different ways in which to implement the functions of History Data Collection Unit 24, FIG. 6 illustrates one particular implementation. In the implementation illustrated in FIG. 6, History Data Collection Unit 24 functions to begin collection of information upon the detection of an error condition, and continues to collect a predetermined amount of information as will be more fully described below. Referring to FIG. 6, OR GATE 141 is a two input OR gate which performs the boolean logic OR function, and may be implemented by a model 74LS32 QUADRUPLE 2-INPUT POSITIVEOR gate manufactured by Texas Instruments, Incorporated of Dallas, Tex. Random Access Memory 140 functions to store information for subsequent retrieval, and in particular is comprised of a plurality of storage locations, each of which is is capable of storing 54 bits of information. Information presented to Random Access Memory 140 on Data Input 142 is stored in the particular locations specified by the 17 bits of address information presented on Address Input 144 upon the occurrence of a write signal on Write Input 146. Thereafter, information previously stored in storage locations within Random Access Memory 140 may be subsequently recalled therefrom from Data Out 148 by placing the address of the desired storage location on Address Input 144, and the appropriate signal on Write Input 146. While there are many ways to implement Random Access Memory 140, one method would be through the use of a plurality of a model 2115 HIGH SPEED STATIC RAM integrated circuits manufactured by INTEL Corporation of Santa Clara, Calif., configured in a manner well known to one of ordinary skill in the art. 17 Bit Multiplexer 150 functions as a 17 pole two position switch, operating pursuant to a signal coupled to Control Input 152 to couple either of inputs 154 or 156 to output 158. It is to be understood that each of inputs 154 and 156 and output 158 are each comprised of 17 individual signal lines. 17 Bit Counter 160 is a counter which counts in a binary format in response to a clock signal coupled to Clock Input 162. The state of 17 Bit Counter 160 is presented on Counter Output 164. It is to be understood that Counter Output 164 is comprised of 17 signal lines. 17 Bit Counter 160 further has Count Enable input 166 which functions to enable or disable the counting function of 17 Bit Counter 160. 17 Bit Counter 160 further generates a Full Count signal 168 which indicates when the state of the count of 17 Bit Counter 160 has reached the maximum count. While there are many ways to implement the functions of 17 Bit Counter 160, one such way would be through the use of a plurality of model 74LS393 DUAL 4-BIT BINARY COUNTERS manufactured by Texas Instruments of Dallas, Tex., and associated logic device to implement the necessary additional functions, in a manner well known to one of ordinary skill in the art. J-K Flip-Flop 170 is a single J-K flip flop having a J Input 172, a K Input 174, a Clock Input CK 176, Q Output 178, and Clear Input 180. J-K Flip Flop 170 is configured to assume a reset state upon initial application of power thereto, in a manner well known to one of ordinary skill in the art. J-K Flip-Flop 170 may be implemented by a model 74LS73 DUAL J-K FLIP-FLOP manufactured by Texas Instruments of Dallas, Tex. One-Shot 182 is a monostable multivibrator having an input 184 and an output 186. One-Shot 182 functions to produce an output pulse of pre-determined duration in response to a transition occurring on the input thereto from a high state to a low state, and may be implemented by a model 74LS122 RETRIGGABLE MONOSTABLE MULTIVIBRATOR manufactured by Texas Instruments of Dallas, Tex.

The foregoing described apparatus of FIG. 6 is configured in the following manner. One input of OR Gate 141 is coupled to RD' signal 36 (FIG. 2B), and th of FIG. 6 is configured in the following manner. One input of OR Gate 141 is coupled to RD' signal 36 (FIG. 2B), and the second input of OR Gate 141 is coupled to WR' signal 38 (FIG. 2B). The output of OR Gate 141 is coupled to Write Input 146 of Random Access Memory 140 and input 184 of One-Shot 182. The first 27 data inputs 142 of Random Access Memory 140 are coupled to m signals 12 from Engineering Prototype Unit 10, i.e., sixteen Address Bus signals A0 thru A15 32, eight Data Bus signals D0 thru D7 34, RD' signal 36, WR' signal 38 and ALE' signal 54 (FIG. 2B). The second set of 27 data inputs 142 of Random Access Memory 140 are coupled to p signals 18 from Analytical Prediction Unit 16, i.e., the 27 signal lines from Data Output 82 of Random Access Memory 74 (FIG. 3). The 17 signal lines of the Address Input 144 of Random Access Memory 140 are coupled to the output of 158 of 17 Bit Multiplexer 150. One input 156 of 17 Bit Multiplexer 150 is coupled to Counter Output 164 of 17 Bit Counter 160. Clock Input 162 of 17 Bit Counter 160 is coupled to ALE' signal 54 (FIG. 2B). Full Count signal 168 from 17 Bit Counter 160 is coupled to K Input 174 of J-K Flip-Flop 170. J Input 172 of J-K Flip-Flop 170 is coupled to Trigger Signal 23 (FIG. 1), i.e., signal 134 from ORGate 132 (FIG. 5). Output signal 186 from One-Shot 182 is coupled to Clock Input 176 of J-K Flip-Flop 170. Full Count Signal 168 from 17 Bit Counter 160 is coupled to K Input of Flip-flop 170.

The foregoing described apparatus operates in the following manner. Upon the initial application of power, a reset signal is applied to Clear Input 180 of J-K FlipFlop 170. This serves to reset J-K Flip-Flop 170. 17 Bit Multiplexer 150 is configured through application of an appropriate signal to Control Input 152 to couple the seventeen signal lines from Counter Output 164 of 17 Bit Counter 160 to Address Input 144 of Random Access Memory 140. Thereafter, upon the detection of a disagreement between an observed signal from Engineering Prototype Unit 10 and the corresponding expected signal from Analytical Prediction Unit 16, i.e., upon the generation of signal 134 from OR-Gate 132, J Input of J-K Flip-Flop 170 is enabled. Thereafter, upon the occurrence of either RD' signal 36 or WR' signal 38 from Engineering Prototype Unit 10 (FIG. 2A), a corresponding signal is produced by OR-Gate 141 which is coupled to Input 184 of One-Shot 182. Said signal produces a pulse of pre-determined duration from One-Shot 182 which is coupled to Clock Input of J-K Flip-Flop 170. On the trailing edge of the pulse produced by One-Shot 182, i.e. the transition from a high to a low state, Flip-Flop 170 changes state such that Q Output 178 is placed in a logic one state. The logic one state of Q Output 178 of J-K Flip-Flop 170 enables 17 Bit Counter 160 to begin counting upon the occurrence of each ALE' signal 54. 17 Bit Counter 160 serves to provide address information for the storage of information from Engineering Prototype Unit 10 (m signals 12) and Analytical Prediction Unit 16 (p signals 18) in Random Access Memory Unit 140. The process of collecting information thereafter continues until 17 Bit Counter 160 reaches a maximum count, at which point Full Count signal 168 applies a logic one signal to K Input 174 of J-K Flip-Flop 170. Thereafter, upon the occurrence of the next RD' signal 36 or WR' signal 38, J-K Flip-Flop 170 will be placed in the reset state, removing the enable signal from Count Enable input 166 of 17 Bit Counter 160, thereby inhibiting further address generation by 17 Bit Counter 160. Thereafter, Random Access Memory 140 contains the status of m signals 12 from Engineering Prototype Unit 10 and p signals 18 from Analytical Prediction Unit 16 which occurred subsequent to the detection of the error condition.

Consequently, Random Access Memory 140 contains information descriptive of both the expected signals as well as the actual signals associated with Engineering Prototype Unit 10 subsequent to the detection of an error condition.

Figure 7:
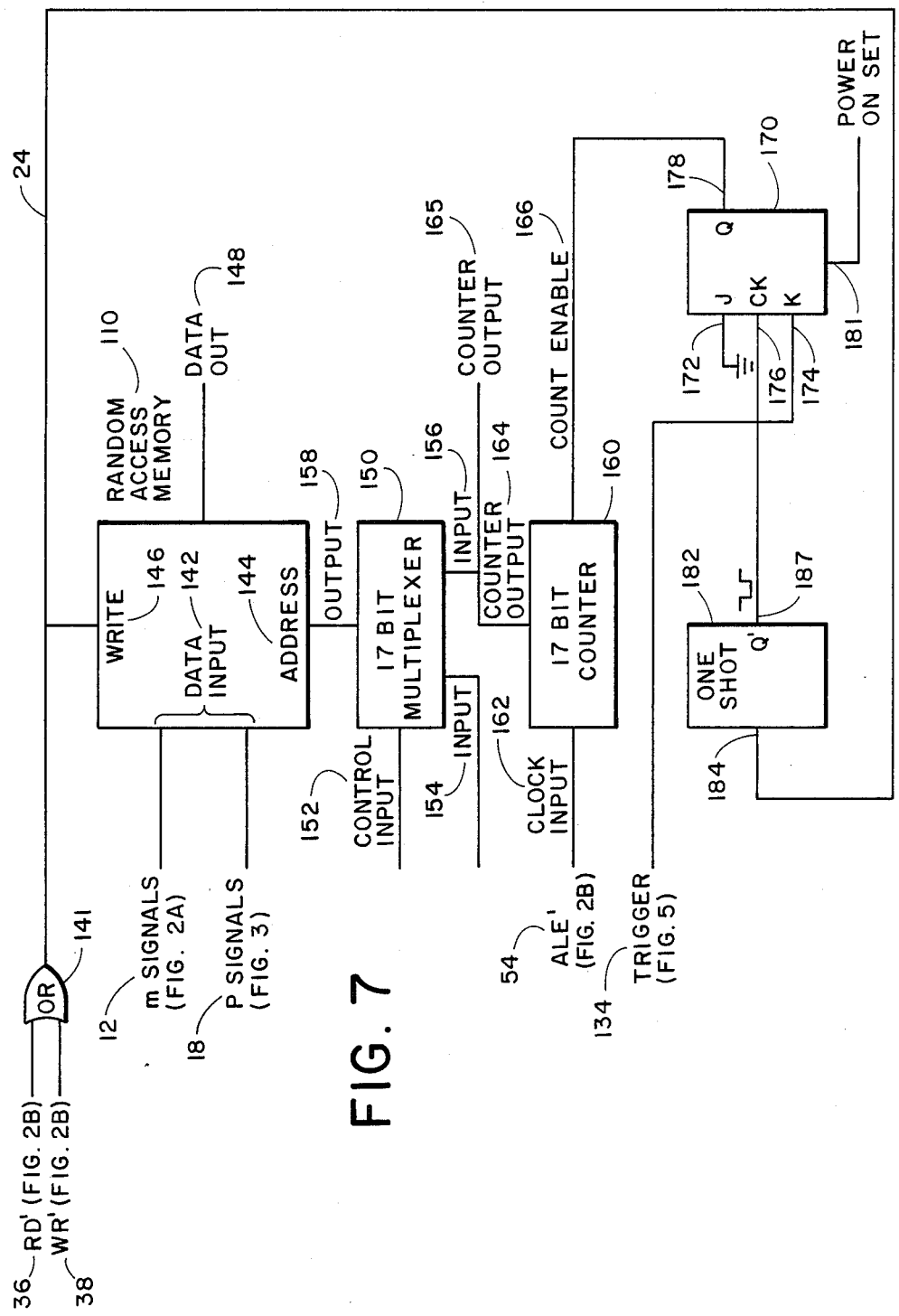
FIG. 7 is an illustration of an alternate implementation of a History Data Collection Unit in accordance with the teachings of the present invention.

An alternate manner to implement History Data Collection Unit 24 would provide for the continuous collection of information from Engineering Prototype Unit 10 and Analytical Prediction Unit 16 until the occurrence of an error condition, and to terminate the collection of said information on the occurrence of the error condition. FIG. 7 illustrates apparatus configured to perform in this manner. The apparatus of FIG. 7 is identical to FIG. 6, differing only in the manner of interconnection among elements. Consequently, corresponding elements have been given like reference designators. Referring to FIG. 7, one input of OR Gate 141 is coupled to RD' signal 36 (FIG. 2B), and the second input of OR Gate 141 is coupled to WR' signal 38 (FIG. 2B). The output of OR Gate 141 is coupled to Write Input 146 of Random Access Memory 140 and Input 184 of One-Shot 182. The first 27 Data Inputs 142 of Random Access Memory 140 are coupled to m signals 12 from Engineering Prototype Unit 10, i.e., sixteen Address Bus signals A0 thru A15 32, eight Data Bus signals D0 thru D7 34, RD' signal 36, WR' signal 38 and ALE' signal 54 (FIG. 2B). The second set of 27 Data Inputs 142 of Random Access Memory 140 are coupled to p signals 18 from Analytical Prediction Unit 16, i.e., the 27 signal lines from Data Output 82 of Random Access Memory 74 (FIG. 3). The 17 signal lines of the Address Input 144 of Random Access Memory 140 are coupled to Output 158 of 17 Bit Multiplexer 150. One input 156 of 17 Bit Multiplexer 150 is coupled to Counter Output 164 of 17 Bit Counter 160. Clock Input 162 of 17 Bit Counter 160 is coupled to ALE' signal 54 (FIG. 2B). J Input 172 of J-K Flip-flop 170 is coupled to ground, i.e. logic zero. The Q' output Signal 187 from One-Shot 182 is coupled to Clock input 176 of J-K Flip-Flop 170. Trigger signal 134 (FIG. 5) is coupled to K Input 174 of Flip-Flop 170. Q Output 178 from J-K Flip Flop 170 is coupled to Count Enable input 166 of 17 Bit Counter 160.

The foregoing described apparatus of FIG. 7 operates in the following manner. Upon the initial application of power, a set signal is applied to Preset Input 181 of J-K Flip-Flop 170. This serves to preset J-K Flip-Flop 170, and place Q Output 178 thereof in the logic one state, thereby enabling the counting of 17 Bit Counter 160 upon the occurrence of each ALE' signal 54 signals on Clock Input 162. 17 Bit Multiplexer 150 is configured through application of an appropriate signal to Control Input 152 to couple the seventeen signal lines of Counter Output 164 from 17 Bit Counter 160 to Address Input 144 of Random Access Memory 140. Thereafter, upon the occurrence of each ALE' signal 54, the current information present in m signals 12 from Engineering Prototype Unit 10 and p signals 18 from Analytical Prediction Unit 16 is recorded in sequential memory locations in Random Access memory Unit 140. In this regard it should be noted that when 17 Bit Counter 160 reaches the maximum count state, it will thereafter begin at zero again, thereby continuously counting from zero to the maximum value, and repeating the process. Consequently, information from Engineering Prototype Unit 10 and Analytical Prediction Unit 16 will be continuously stored in Random Access Memory Unit 140 until the maximum count is reached by 17 Bit Counter 160, and thereafter newly recorded information will be written over previously recorded information in Random Access Memory 140. In this manner, information from Engineering Prototype Unit 10 and Analytical Prediction Unit 16 will be continuously stored in Random Access Memory Unit 140. Upon the detection of an error condition, K Input 174 of J-K Flip-Flop 170 will be placed at a logic one state by Trigger signal 134. Thereafter, upon the occurrence of the next RD' signal 36 or WR' signal be placed at a logic one state by Trigger signal 134. Thereafter, upon the occurrence of the next RD' signal 36 or WR' signal 38, Flip-Flop 170 will assume the reset state, causing Q Output 178 to assume a logic zero state. This will inhibit further counting by 17 Bit Counter 160. Subsequent to the termination of collection of information by the occurrence of an error condition, the address at which information collection is stopped is present on counter output signal 165. Thereafter, Random Access Memory 140 contains information descriptive of both the expected signals as well as the actual signals associated with Engineering Prototype Unit 10 prior to the detection of an error condition.

The information collected by History Data Collection Unit 24 (FIG. 1) in the two alternative implementations illustrated in FIGS. 6 and 7 may be subsequently coupled to General Computer 102 for analysis by Address Latch 91, Control Latch 93, Data Buffer 95 and Data Buffer 97 (FIG. 3). In particular, with respect to FIG. 6, General Computer 102 would place an address of a desired storage location within Random Access Memory 140 on Input 152 of 17 Bit Multiplexer 158 through Address Latch 91 (FIG. 3), configuring 17 Bit Multiplexer 150 to couple the address information so supplied to address 144 of Random Access Memory 140 by control input 152 through Control Latch 93 (FIG. 3). The information contained in the designated storage location within Random Access Memory 140 would thereafter be coupled to General Computer 102 from Data Out 148 of Random Access Memory 140 through Data Buffer 95 (FIG. 3) to General Computer 102. The foregoing described apparatus would operate in an identical manner with respect to the implementation of the History Data Collection Unit illustrated in FIG. 7, with the further addition that the address at which information collection is stopped, as indicated by counter output signal 165 is coupled to General Computer 102 through Data Buffer 97 (FIG. 3).

In this disclosure there is described a preferred method and apparatus for monitoring and detection of improper device operation. It should be understood, however, that while a particular implementation of the foregoing was described, such description was for illustrative purposes only, and is not to be considered to be limiting of the invention herein. For instance, there would be many ways to implement the functions of Engineering Prototype Unit, Analytical Prediction Unit, Comparator, OR GATE and History Data Collection Unit which would differ from the illustration contained herein, without departing from the scope and spirit of the present invention. Consequently, while this invention has been described with reference to the particular implementation disclosed herein, it is not necessarily confined to the details set forth and this application is intended to cover any modifications or changes as may come within the scope of the following claims.

I claim:

1. Apparatus for monitoring the operation of a device to detect improper operation thereof in response to the application of a series of test monitoring the operation of a device to detect improper operation thereof in response to the application of a series of test vectors applied thereto, said device generating information signals and operation signals in response to each applied test vector, said apparatus comprising:

predicting means for predicting correct operation of the device by generating expected information and operation signals in response to the application of the series of test vectors applied thereto;

comparing means responsive to the operation of the device and to said predicting means for comparing the operation signals of the device with the expected operation signals in response to the same test vector;

detection means responsive to said comparing means for detecting improper operation of the device; and storage means coupled to said device and to said prediction means responsive to said detection means for storing information signals representative of the operation of the device and the expected operation signals for the same application of test vectors, said storage means includes:

first storage means coupled to the device responsive to said detection means for storing information signals descriptive of the operation of the device subsequent to the detection of improper operation of the device in response to the corresponding operation and expected operation signals; and, second storage means coupled to the predicting means responsive to said detection means for storing expected information signals descriptive of the predicted correct operation of the device subsequent to the detection of improper operation of the device in response to the corresponding operation and expected operation signals.

2. Apparatus as recited in claim 1 wherein said predicting means further comprises:

program means for modeling the operation of the device;

digital computer means for performing said program means so that the expected information and operation signals of the device is determined; and, prediction storage means responsive to said digital computer means for storing the expected information and operation signals of the device.

3. Apparatus as recited in claim 1, wherein said comparing means further comprises a plurality of single comparing means for comparing a single signal from the device with a corresponding single signal from said predicting means.

4. A method for monitoring the operation of a device to detect the improper operation thereof in response to the application of a series of test vectors applied thereto, said device generating information signals and operation signals in response to each applied test vector, said method comprising the steps of:

predicting the correct operation of the device by generating expected information and operation signals in response to the application of each of the series of test vectors;

repeatedly comparing the operation signals of the device with the expected operation signals to detect improper device operation in response to each of the test vectors;

detecting improper device operation by detecting comparison errors; and repeatedly storing information signals representative of the operation of the device and expected information signals representative of the predicted correct operation of the device in response to the detection of improper device operation.

5. A method for monitoring the operation of a device to detect the improper operation thereof as in claim 4 further comprising the step of terminating the storing of information signals representative of the device and expected information signals in response to the detection of improper device operation.

6. Apparatus for monitoring digital information produced by a digital device, to detect improper operation thereof, comprising:

predicting means responsive to the digital device for producing digital expected information and operation signals representative of the digital information and operation signals expected to be produced by the digital device;

comparing means responsive to digital information signals produced by the digital device and to the expected digital information signals produced by said predicting means for detecting a difference therebetween;

detecting means responsive to said comparing means for producing a signal in response to the detection of a difference between the digital information signals produced by the digital device and the digital expected information signals produced by said predicting means;

storage means responsive to the signal produced by said detecting means, coupled to the digital device and to the predicting means for storing digital operation signals of the digital device and for storing digital expected operation signals produced by said predicting means.

7. Apparatus as recited in claim 6, wherein said predicting means further comprises storage means for storing digital expected information and operation signals representative of the digital information expected to be produced by the digital device;

control means coupled to said storage means and responsive to said digital device for sequentially extracting from said storage means the digital expected information and operation signals expected to be produced by the digital device.

8. Apparatus as recited in claim 6, wherein said predicting means comprises:

determining means for producing the digital expected information and operation signals expected to be produced by the digital device;

counter means responsive to the digital device for producing a cyclic sequence of binary numbers;

memory means coupled to said counter means for storing and reproducing the digital expected information and operation signals expected to be produced by the digital device; and, control means responsive to the digital device and said counter means for storing in and extracting from said memory means the digital expected information and operation signals expected to be produced by the digital device.

9. Apparatus as recited in claim 6, wherein said comparing means further comprises a plurality of comparing devices, each of which comparing devices compares a single first signal with a single second signal, and produces an output signal if the first signal does not agree with the second signal.

10. Apparatus as recited in claim 9, wherein said comparing device is an EXCLUSIVE-OR gate.

11. Apparatus as recited in claim 9, wherein said detecting means further comprises an OR gate having a plurality of inputs thereto, with each input coupled to the output of one of the plurality of comparing devices.

12. Apparatus as recited in claim 6, wherein said storage means further comprises means for storing digital operation signals of the digital device and for storing digital expected operation signals produced by said predicting means in response to the signal produced by said detecting means.

13. Apparatus as recited in claim 6, wherein said storage means further comprises means for continuously storing digital operation signals of the digital device and for continuously storing digital expected operation signals produced by said predicting means, and terminates the storing of said operation signals in response to the signal produced by said detecting means.

14. Apparatus as recited in claim 6, wherein said storage means further comprises:

counter means coupled to the digital device for producing a binary count;

digital storage means coupled to the digital device, the predicting means and said counter means for storing digital operation signals of the digital device and for storing digital expected operation signals produced by said predicting means; and control means coupled to said counter means and responsive to said detection means for controlling the counting of said counter means.

15. Apparatus as recited in claim 14, wherein said control means further comprises means for inhibiting the operation of said counter means responsive to a preselected binary count being produced by said counting means.

16. Apparatus as recited in claim 14, wherein said control means further comprises means for inhibiting the operation of said counter means responsive to the signal produced by said detecting means.

17. A method for testing the proper performance of a device, said method comprising the steps of:

applying test criteria to a simulator of the device for producing expected information and operation signals therefrom;

applying at least on of the test criteria applied to the simulator to the device to be tested for producing at least one set of information and operation signals therefrom;

comparing the expected operation signals from the simulator with the operation signals from the device to the same test criteria to detect errors in the performance of the device; and repeatedly storing information signals of the device and the expected information signals from the simulator when an error is detected in the comparing step.

18. A method for testing the proper performance of a device as in claim 17 wherein the performance comparing step includes the step of terminating the testing when at least one of the responses from the device does not compare with the expected responses from the simulator.

19. Apparatus for testing the proper performance of a device comprising:
   a simulator means for modeling the desired performance of the device;
   first means for applying test criteria to the simulator means for producing expected information and operation signals therefrom;
   second means for applying at least one of the test criteria applied to the simulation means to the device to be tested for producing at least one set of information and operation signals therefrom;
   third means for comparing the expected operation signals from the simulator means with the operation signals from the device to the same test criteria to detect errors in the performance of the device; and
   means for repeatedly storing information signals of the device and the expected information signals from the simulator means when when an error is detected by the third means.

20. Apparatus for testing the proper performance of a device as in claim 19 wherein the third means includes means for terminating the testing when at least on of the operation signals from the device does not compare with the expected information signals from the simulator means.

21. Apparatus for monitoring the operation of a device to detect improper operation thereof in response to the application of a series of test vectors applied thereto, comprising:
   predicting means for predicting expected information and operation signals of the device in response to the application of the series of test vectors applied thereto;
   comparing means responsive to the operation signals of the device and to said expected operation signals of the predicting means for comparing the operation of the device with the predicted correct operation in response to the same test vector;
   detection means responsive to said comparing means for detecting improper operation of the device; and
   storage means coupled to said device and to said predicting means responsive to said detection means for storing information signals of the device and the expected information signals, said storage means includes:
   first storage means coupled to the device and responsive to said detection means for storing information signals of the device prior to the detection of improper operation of the device; and
   second storage means coupled to the predicting means and responsive to said detection means for storing expected information signals prior to the detection of improper operation of the device.

* * * * *